United States Patent [19]

Flores et al.

[11] Patent Number: 5,570,740
[45] Date of Patent: Nov. 5, 1996

[54] BUILT-IN COOLING SYSTEM FOR AN ENCLOSURE

[75] Inventors: Michael A. Flores; Peter A. Massacesi, both of Plano; Andrew G. Low, McKinney, all of Tex.

[73] Assignee: DSC Communications Corporation, Plano, Tex.

[21] Appl. No.: 398,655

[22] Filed: Mar. 3, 1995

[51] Int. Cl.$^6$ .................................................. F28D 15/00
[52] U.S. Cl. .................... 165/104.34; 361/724; 361/697; 62/94
[58] Field of Search ................... 165/104.34, 104.33; 361/727, 725, 724, 697, 696, 695; 257/722, 721, 712; 62/94, 93

[56] References Cited

U.S. PATENT DOCUMENTS

| | | | |
|---|---|---|---|
| 4,386,651 | 7/1983 | Reinhard | 361/696 X |
| 4,449,579 | 5/1984 | Miyazaki et al. | 361/696 X |
| 4,719,761 | 1/1988 | Cromer | 62/94 |
| 4,949,218 | 8/1990 | Blanchard et al. | 361/696 |
| 4,997,034 | 3/1991 | Steffen et al. | 165/104.34 |
| 5,136,464 | 8/1992 | Ohmori | 361/724 X |
| 5,230,466 | 7/1993 | Moriya et al. | 62/94 X |

FOREIGN PATENT DOCUMENTS

| | | | |
|---|---|---|---|
| 0147182 | 3/1981 | Germany | 165/104.34 |
| 0056695 | 4/1984 | Japan | 165/104.34 |
| 0157481 | 9/1984 | Japan | 165/104.34 |

*Primary Examiner*—John Rivell
*Assistant Examiner*—Christopher Atkinson
*Attorney, Agent, or Firm*—Baker & Botts, L.L.P.

[57] ABSTRACT

The built-in cooling system (12) is located centrally in the cabinet enclosure (10) and includes at least one plenum (22) having an interior chamber mounted in a roof area (24) of the enclosure (10). The plenum (22) is in fluid isolation from the air within the enclosure (10), but has at least one vent (66) being in fluid association with the ambient air outside of the enclosure (10). The plenum (22) is coupled to a heat exchanger column (20) located centrally in the enclosure (10) with an internal air passageway (78) with intake and exit ports (70, 72), and having an external air passageway (76) with intake and exit ports. The external air passageway (76) is in fluid association with the chamber of the plenum (22). At least one heat sink (40) is mounted above the electronic equipment in the plenum (22) between the external air passageway exit port (48) and the vent (66) of the plenum (22). The internal air in the heat exchanger column (20) is circulated by an internal air fan (26) and the external air therein is circulated by an external air fan (25).

29 Claims, 4 Drawing Sheets

BUILT-IN COOLING SYSTEM FOR AN ENCLOSURE

TECHNICAL FIELD OF THE INVENTION

This invention is related in general to cabinet enclosures for housing electronic equipment. More particularly, the invention is related to a built-in cooling system for the enclosure.

BACKGROUND OF THE INVENTION

Bell Communications Research (Bellcore) and BellSouth Telecommunications have established more stringent requirements for electronic equipment cabinets. These customized cabinets are intended to house various types of telecommunications equipment, including active electronic and optical systems and passive mechanical cross-connect and splicing fields. The cabinets are required to protect the electronics equipment from a wide range of ambient temperatures and inclement climatic conditions including rain, snow, sleet, high winds, wind driven rain, ice, and sand storms. These cabinets must pass stringent weathertightness rain intrusion, wind driven rain intrusion, salt fog spray, temperature cycling, and high humidity tests. Bellcore's General Requirements for Electronic Equipment Cabinets, Technical Advisory TA-NWT-000487, Issue 2, June 1993, and BellSouth Telecommunications' Electronic Equipment Cabinets (Subscriber Carrier/Fiber in the Loop), Specification BS-631-0032, Issue 1, November 1992, may be consulted for a detailed description of the requirements and the test criteria. To provide weathertightness, all possible entry points for moisture must be either welded closed or sealed.

In addition to the weathertightness requirement is the need to cool the heated air internal to the cabinet enclosure. The electronics equipment housed by the cabinets generate large amounts of heat that must be dissipated to avoid equipment failure. The cooling system must provide entry and exit points for external ambient air to remove heat gain accumulated in the cabinet. However, the external air entry and exit points must be well-guarded against driving rain and other intrusive moisture. Further, the cooling system is required to circulate air within the cabinet efficiently and evenly without leaving pockets of hot air. Prior equipment cabinets require the use of distributed fans or fan trays located at various spots in the cabinet to circulate air. This is not cost-effective and takes up additional room in the cabinet.

SUMMARY OF THE INVENTION

Accordingly, a need has arisen for an efficient built-in cooling system for a cabinet enclosure that minimizes the intrusion of moisture. In accordance with the present invention, the cooling system eliminates or substantially reduces the disadvantages associated with prior cooling units or systems.

In one aspect of the invention, the built-in cooling system is located centrally in the cabinet enclosure and includes at least one plenum having an interior chamber mounted in a roof area of the enclosure. The plenum is in fluid isolation from the air within the enclosure, but has at least one vent being in fluid association with the ambient air outside of the enclosure. The plenum is coupled to a heat exchanger column located centrally in the enclosure having an internal air passageway with intake and exit ports, and having an external air passageway with intake and exit ports. The external air passageway is in fluid association with the chamber of the plenum. At least one heat sink is mounted above the electronic equipment in the plenum between the external air passageway exit port and the vent of the plenum. The internal air in the heat exchanger is circulated by an internal air fan and the external air therein is circulated by an external air fan.

In another aspect of the invention, moisture deflectors are arranged in the plenum for preventing the entry of moisture into the external air passageway through the external air exit port. Also provided is a moisture collection apparatus in fluid association with the external air passageway.

BRIEF DESCRIPTION OF THE DRAWINGS

For a better understanding of the present invention, reference may be made to the accompanying drawings, in which.

DETAILED DESCRIPTION OF THE INVENTION

The preferred embodiment of the present invention and its advantages are best understood by referring to FIGS. 1–5 of the drawings, like numerals being used for like and corresponding parts of the various drawings.

Figure 1:
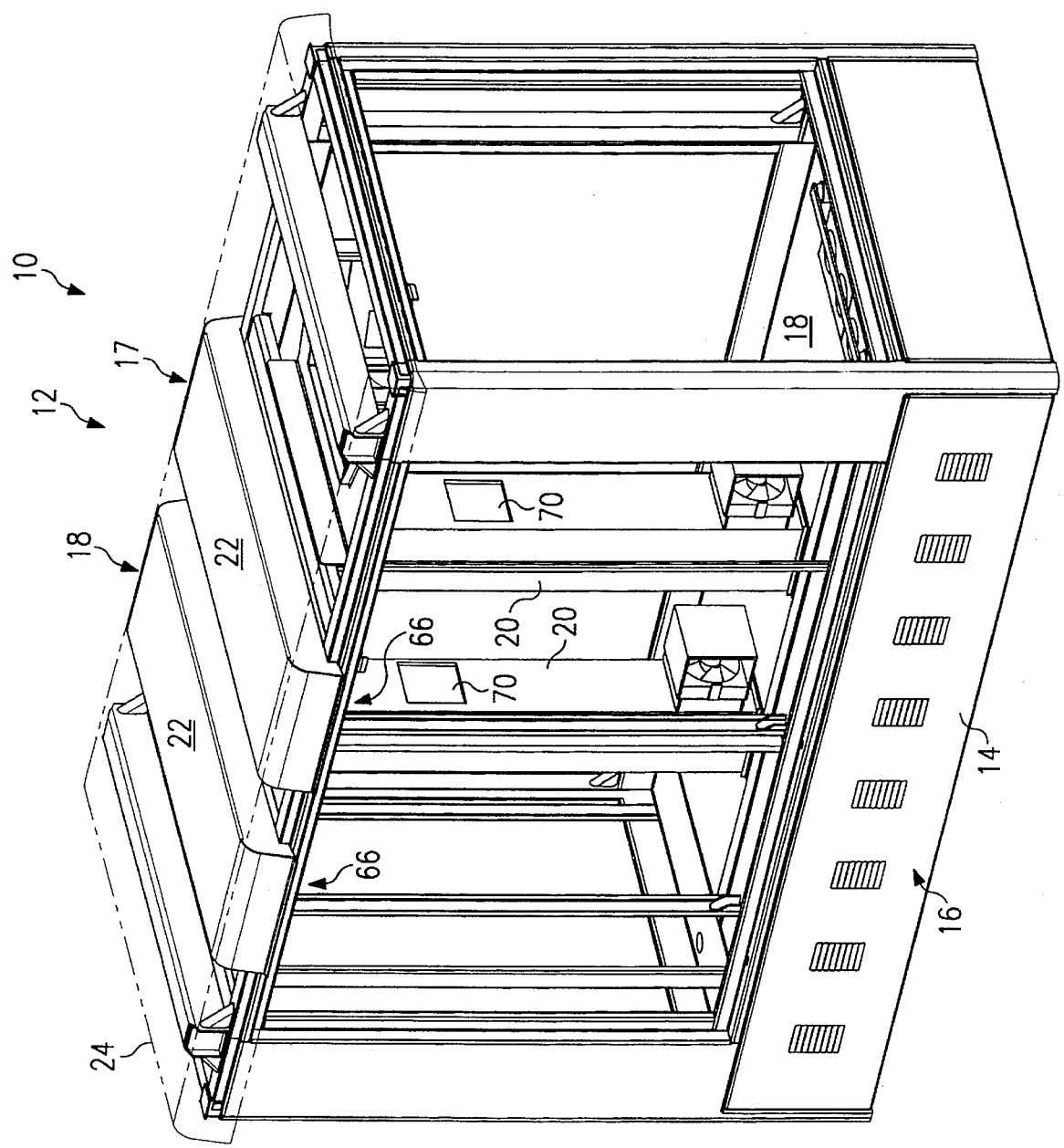
FIG. 1 is a perspective view of a cabinet enclosure with a built-in cooling system constructed in accordance with the present invention.
Figure 2:
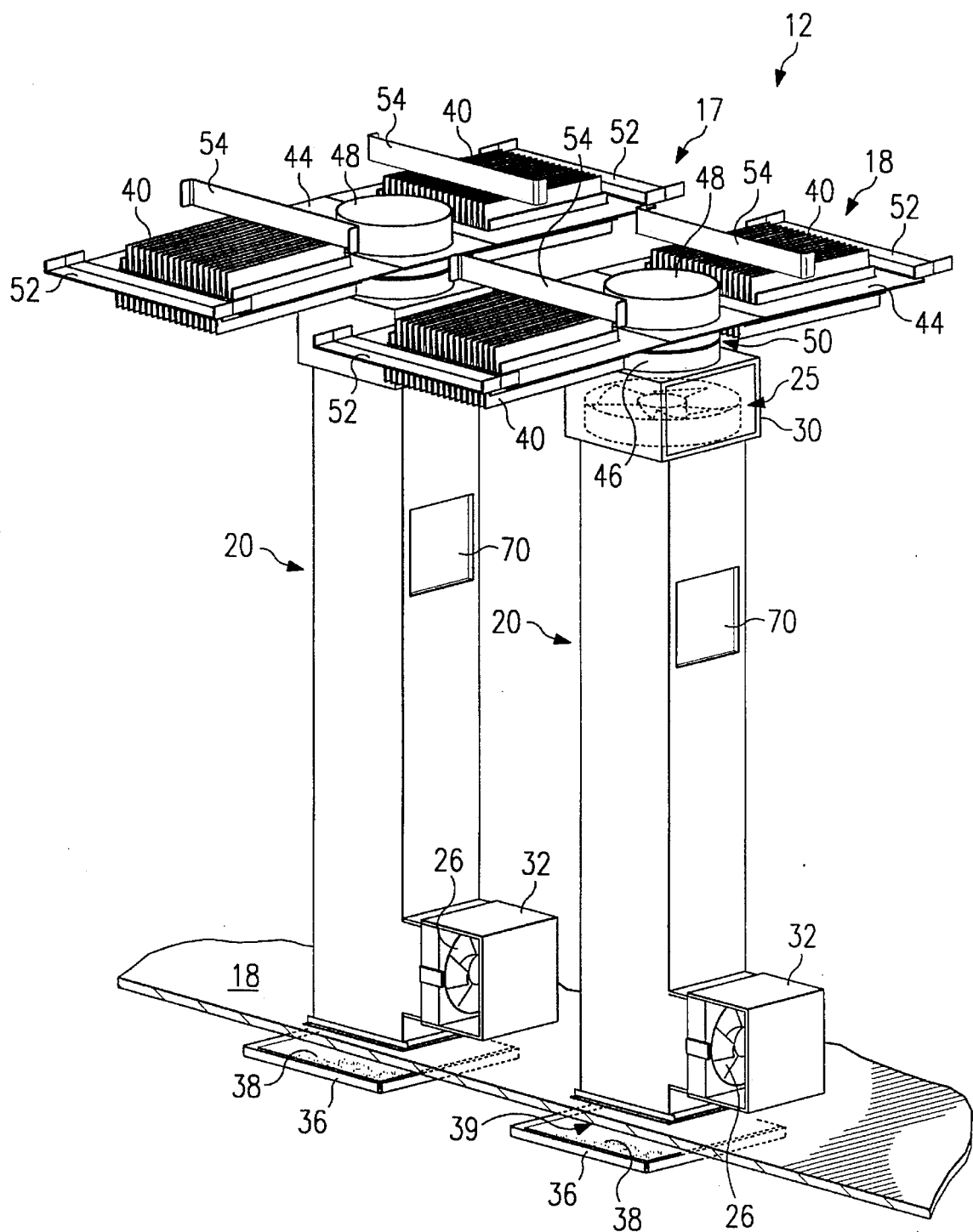
FIG. 2 is a perspective view of an embodiment of the built-in cooling system showing additional details.

Referring to FIGS. 1–2, a cabinet enclosure 10 constructed with an integral built-in cooling system 12 is shown. A brief overview of the basic structure of the cabinet enclosure 10 is instructive. The cabinet enclosure 10 is designed with an internal tubular frame structure with outer skins attached thereto for optimal weathertightness and electromagnetic interference shielding. Equipment racks may be installed in the cabinet enclosure 10 to support electronic equipment (not shown), and drawers located behind side panels 14 are provided below to house additional equipment such as backup power batteries (not shown). A floor skin 18 separates the well-protected cabinet enclosure 10 housing the electronic equipment and the storage area below. The side panels 14 are constructed with louvered air openings 16 pointing downward for adequate ventilation and air intake. Six side access doors, removed in FIG. 1 for a clear internal view of the cabinet 10, are provided to allow easy craft access to the equipment.

The cooling system 12 includes two identical and centrally located cooling towers 17 and 18. Each cooling tower 17 and 18 includes a heat exchanger column 20 and a heat sink housed inside a plenum 22 located in the roof area of the cabinet enclosure 10. Note that the roof skin 24 is shown in phantom in FIG. 1. Two sets of fans 25 and 26, are mounted in the heat exchanger columns 20 to create an external air circulation path and an internal air circulation path, respectively, in both cooling towers 17 and 18. The external air fan 25 is mounted in-line within the heat exchanger column 20 in a housing 30 near the top of the column 20. The internal air fan 26 is mounted in a housing 32 near the base of the heat exchanger column 20. The fan housings 30 and 32 are constructed to facilitate scheduled maintenance and/or replacement of the fans and are described below in detail in conjunction with references to FIG. 5.

At the base of each heat exchanger column 20 is a moisture collection tray 36. The moisture collection trays 36 are shallow trays located below the level of the floor skin 18 and contain an absorbent material 38 such as sponge and the like to collect moisture. The collection tray 36 does not close off access to the air passageways in the heat exchanger column 20. However, the interface between the base of each heat exchanger column 20 and the floor skin 18 includes a gasket 39 which functions to keep moisture out of the interior of the cabinet enclosure 10.

At the top of the heat exchanger columns 20 are heat sinks 40 housed inside two plenums 22 located immediately under the roof skin 24. The heat sinks 40 are constructed from a good heat conductor such as aluminum, and may be formed by extrusion with a custom die. Each heat sink 40 includes a plurality of cooling fins extending above and below a divider plate 44 which is installed atop the heat exchanger column 20. The interface between the divider plate 44 and the plenum 22 includes a sealing gasket (hidden from view) to further ensure moisture present above the divider plate 44 does not enter into the cabinet enclosure 10.

The top of the heat exchanger column 20 is coupled to the divider plate 44. The heat exchanger column 20 terminates in a circular collar 46 above the external air fan housing 30, which is coupled to a circular tube 48 that passes through and extends above the divider plate 44. The interface between the circular collar 46 of the heat exchanger column 20 and the circular tube 48 is sealed against air or moisture leaks with an appropriate gasket 50. The circular tube includes a section that extends above the level of the divider plate 44 to guard against water entering the heat exchanger column 20. Alternatively, the circular collar 46 and the circular tube 48 may be an integral unit. Also provided are horizontal and vertical water deflectors 52 and 54 coupled to the divider plates 44 or the plenums 22. These water deflectors 52 and 54 greatly reduce the amount of water that enters the heat exchanger columns 20 by eliminating a direct path thereto.

Figure 3:
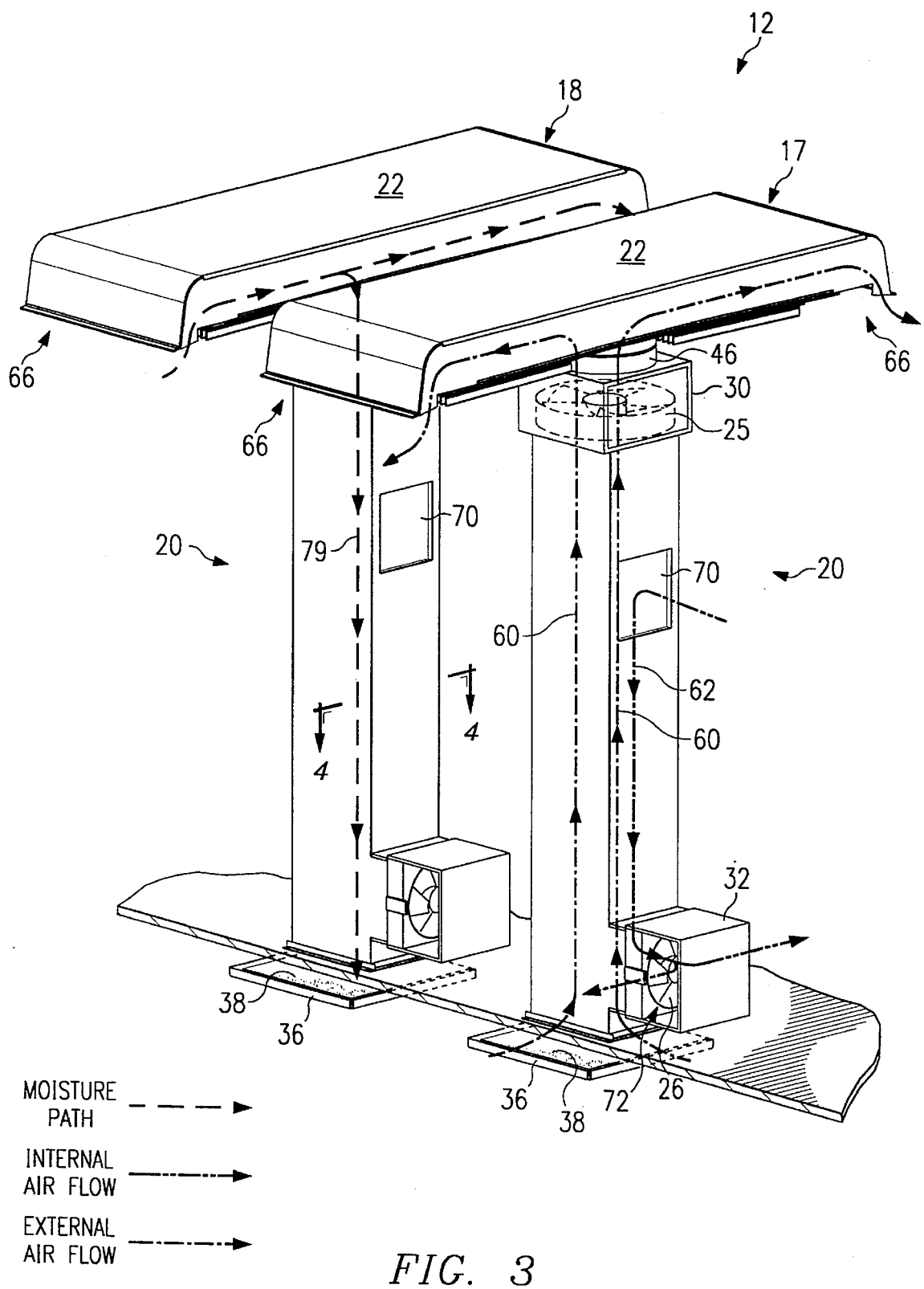
FIG. 3 is a perspective view of an embodiment of the built-in cooling system with illustrated moisture and air flow.

FIG. 3 shows the paths taken by the external air flow, indicated by arrows labeled by reference numeral 60, and the paths taken by the internal air flow, indicated by arrows labeled by reference numeral 62 in one of the heat exchanger columns 20. The cooling towers 17 and 18 are arranged in the cabinet enclosure so that the heat sinks 40 are generally located directly above the heat generating electronics equipment. The heat from the equipment rises to the ceiling of the cabinet enclosure 10 by free convection. The hot air transfers the heat to the bottom cooling fins of the heat sinks 40, which further transfers the heat to the top cooling fins. The heat in the heat sinks 40 is then removed by external air forced over them. The heat exchanger columns 20 are also arranged to be in the midst of the equipment racks where hot air is generated and most likely to concentrate. To remove the heat, cooler external air is circulated in the heat exchanger columns 20 and over the heat sinks 40 in the manner described below.

Recall FIG. 1 shows the side panels 14 include louvered air vents 16 which permit cooler external air to flow into the bottom portion of the cabinet 10.

The external air circulation path is indicated by arrows referenced by numerals 60. The cooler external air enters the heat exchanger columns 20 through openings created in the floor skin 18 located at the base of the heat exchanger columns 20. Optionally, an underground cooling tunnel of a predetermined length and configuration may be in fluid association with the external air passageway intake port at the bottom of the heat exchanger columns 20 to supply even cooler air. The cooler external air is forcefully pulled upward in the columns 20 by fans 25 mounted horizontally in a housing located near the top of the heat exchanger columns 20. The external air fan 25 is preferably rated at least 350 cubic feet per minute (CFM) against zero static pressure and is treated and/or constructed to resist the corrosive effects of a salty atmosphere. The external air then exits the column 20 through the circular collar 46 and the circular tube 48 into the plenum 22. The cool external air then passes over the cooling fins of the heat sinks 40 and exits through soffit ventilation ports 66 located under the eaves of the roof skin 24. The heat in the heat sinks 40 and the heat exchanger element 74 is thus removed by the circulating external air and carried out of the cabinet enclosure 10.

The internal air circulation path is indicated by arrows referenced by numeral 62. The heated internal air enters the heat exchanger column 20 through an intake port 70 formed in the side of the column near the top. The internal air is drawn downward in the heat exchanger column by the internal air fan 26 and exits through side ports 72 formed in the fan housing 32. Preferably, the internal air fan 26 is rated at least 275 cubic feet per minute against zero static pressure.

Figure 4:
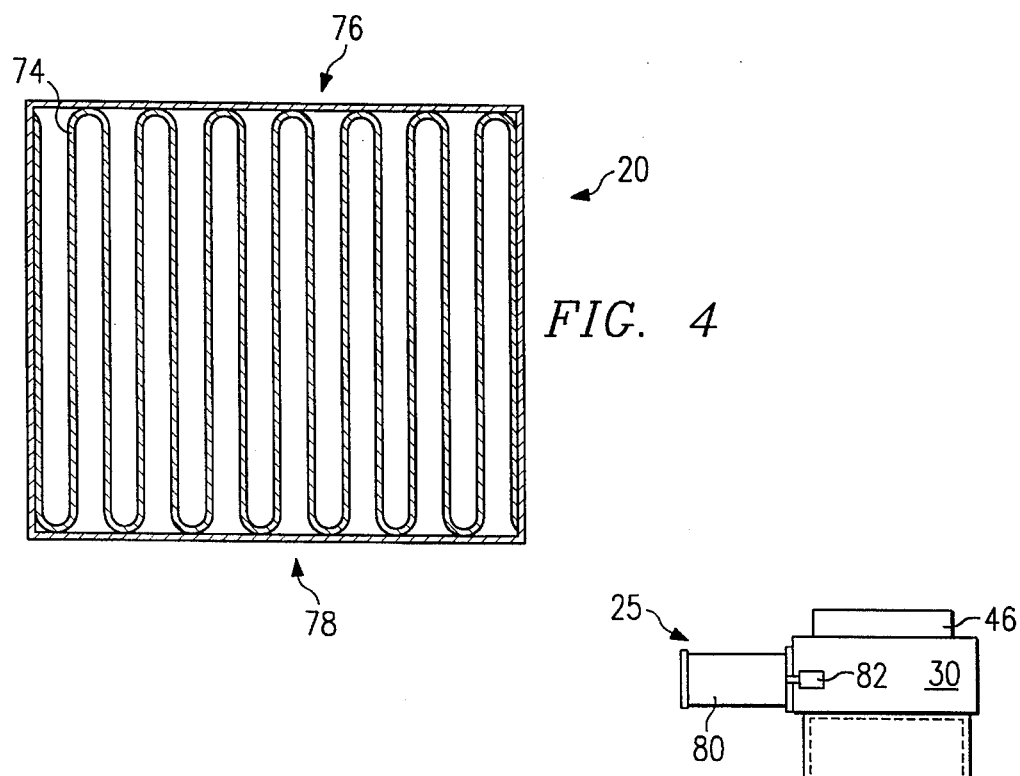
FIG. 4 is a cross-sectional view of an embodiment of the heat exchange element along line 4—4 in FIG. 3.

FIG. 4 shows a cross-sectional view of an embodiment of the heat exchanger column 20. A heat exchanger element 74 separates the external air passageway 76 from the internal air passageway 78 so that the two air flows 60 and 62 do not mix. The serpentine heat exchanger element 74 is constructed to provide the maximum contact surface for the air streams for optimal heat transfer from the internal air to the external air. It may be seen that the internal air passageway 78 is sealed at a point above the intake port 70 so that the external air fan 25 has no effect on the internal air flow.

FIG. 3 further shows the possible paths taken by moisture that enters the system. The moisture paths are indicated by arrows labeled by reference numeral 79. Rain water, propelled by hard driving wind, may enter the plenums 22 through the external air exit ports 66. However, most of the rain water will encounter the deflectors 54 (FIG. 2) and drop onto the divider plate 44 and drain out through the exit ports 66. In some instances, the moisture may get past the deflectors 54 and overcome the barrier presented by the circular tube 48 and enter the heat exchanger columns 20. The moisture that enters the heat exchanger columns 20 remains on the external air passageway 76 and drains downward into the moisture collection tray 36 located immediately below the floor skin 18 at the base of the columns 20. There the moisture is absorbed by the sponge 38. The moisture will eventually evaporate and be carried out by the incoming external air passing over the sponge.

Figure 5:
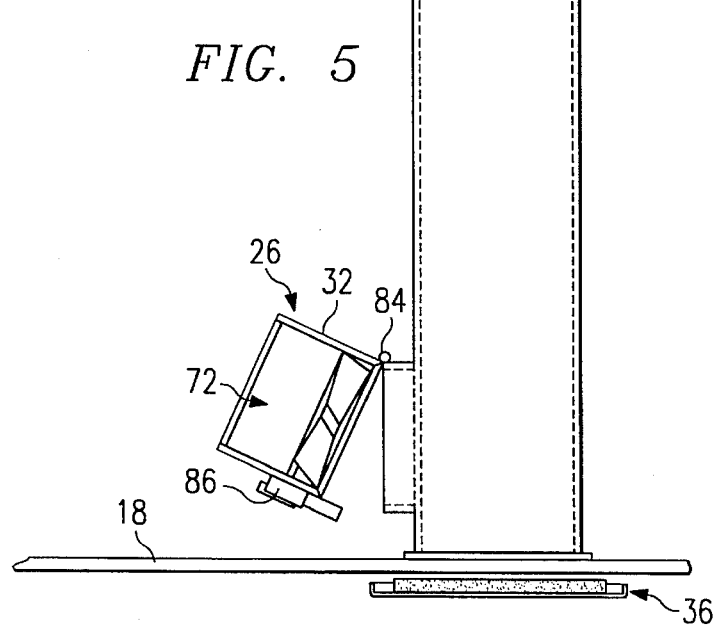
FIG. 5 is a side view showing an embodiment of the replacement fan housings.

Referring to FIG. 5, a side view of the heat exchanger column 20 showing the replacement feature of the fan housings is provided. The external fan housing 30 features a slide-out drawer 80 which contains the external air fan 25. The drawer 80 is fastened shut by latches 82 located on both sides of the housing 30 during operations. When the external air fan 25 must be repaired, replaced or have maintenance work done, it may be easily accessed or removed by sliding out the drawer 80. A replacement kit including the drawer 80 with a fan installed therein may be provided for a quick change out.

The internal air fan 26 may also be accessed easily by unfastening retainer clips 84, latches 86 and the like which attach the fan housing 32 to the heat exchanger column 20. The internal air fan 26 may be easily replaced by detaching the housing 32, and installing a replacement housing with a replacement fan installed therein.

Constructed and operated in this manner, the electronic equipment cabinet enclosure 10 is effectively cooled by an integrated built-in cooling system 12. The system 12 is centrally located within the cabinet enclosure 10 among the electronic equipment for optimal air circulation and heat removal. Further, the built-in cooling system 12 does not compromise the weathertight requirement of the cabinet enclosure 10.

Although the present invention and its advantages have been described in detail, it should be understood that various changes, substitutions and alterations can be made therein without departing from the spirit and scope of the invention as defined by the appended claims.

What is claimed is:

1. A built-in cooling system for an enclosure housing electronic equipment, comprising:

at least one plenum having an interior chamber mounted in a roof area of said enclosure, said plenum having at least one vent being in fluid association with ambient air outside of said enclosure;

a heat exchanger column located centrally in said enclosure having an internal air passageway with internal air intake and exit ports, and having an external air passageway with an external intake and exit ports, said internal and external air passageways having a large mutual contact surface area, and said external air passageway being in fluid association with said interior chamber of said plenum;

an internal air fan mounted on said heat exchanger column circulating internal air through said internal air passageway;

an external air fan mounted on said heat exchanger column circulating external air through said external air passageway;

a divider plate mounted between said interior chamber of said plenum and said enclosure and substantially sealing said plenum chamber from said enclosure;

at least one heat sink mounted to said divider plate adjacent to said external air exit port, generally one half of said heat sink being positioned in said enclosure and generally the other half of said heat sink being positioned in said plenum chamber; and moisture deflectors arranged in said plenum for preventing the entry of moisture into said external air passageway through said external air exit port.

2. The built-in cooling system, as set forth in claim 1, further comprising a moisture collection apparatus in fluid association with said external air passageway.

3. The built-in cooling system, as set forth in claim 1, further comprising a moisture collection tray located at a base of said heat exchanger column.

4. The built-in cooling system, as set forth in claim 3, wherein said moisture collection tray includes a sponge.

5. The built-in cooling system, as set forth in claim 1, wherein said external air intake port is located at a base of said heat exchanger column and said external air exit port is located at a top of said heat exchanger column in said plenum chamber.

6. The built-in cooling system, as set forth in claim 5, wherein said external air fan is mounted in line with said external air passageway near said exit port.

7. The built-in cooling system, as set forth in claim 1, wherein said internal air intake port is located near a top of said heat exchanger column and said internal air exit port is located near a base of said heat exchanger column, and said internal air fan is mounted near said base of said heat exchanger column.

8. The built-in cooling system, as set forth in claim 1, wherein said external air exit port includes a collar extending through and above said divider plate.

9. The built-in cooling system, as set forth in claim 1, further comprising an external air fan housing mounted in said heat exchanger column.

10. The built-in cooling system, as set forth in claim 9, wherein said external air fan housing is detachably fastened to said heat exchanger column by fasteners.

11. The built-in cooling system, as set forth in claim 10, wherein said external air fan housing includes:

a drawer housing said external air fan;

an outer housing accommodating said drawer; and at least one latch latching said drawer to said outer housing.

12. The built-in cooling system, as set forth in claim 1, further comprising an internal air fan housing mounted in said heat exchanger column.

13. The built-in cooling system, as set forth in claim 12, wherein said internal air fan housing is detachably fastened to said heat exchanger column by fasteners.

14. The built-in cooling system, as set forth in claim 1, further comprising two heat exchanger columns coupled respectively to two plenums.

15. The built-in cooling system, as set forth in claim 14, further comprising two heat sinks mounted in each plenum.

16. A built-in cooling system for an enclosure housing electronic equipment, comprising:

at least one plenum having an interior chamber mounted in a roof area of said enclosure, said plenum being in fluid isolation from air within said enclosure, and said plenum having at least one vent being in fluid association with ambient air outside of said enclosure;

at least one heat exchanger column located centrally in said enclosure having an internal air passageway with intake and exit ports, and having an external air passageway with intake and exit ports, said internal and external air passageways having a large mutual contact surface area, and said external air passageway being in fluid association with said chamber of said plenum;

at least one heat sink mounted above said electronic equipment in said plenum between said external air passageway exit port and said vent of said plenum, generally one half of said heat sink being in contact with air within said enclosure and generally the other half of said heat sink being in contact with air within said plenum chamber;

an internal air fan mounted on said heat exchanger column circulating internal air through said internal air passageway;

an external air fan mounted on said heat exchanger column circulating external air through said external air passageway; and a moisture collection tray being located at a base of said heat exchanger column and in fluid association with said external air passageway.

17. The cooling system, as set forth in claim 16, further comprising moisture deflectors arranged in said plenum for preventing the entry of moisture into said external air passageway.

18. The cooling system, as set forth in claim 16, wherein said moisture collection tray includes a sponge.

19. The cooling system, as set forth in claim 18, wherein said external air intake port is located at a base of said heat exchanger column and said external air exit port is located at a top of said heat exchanger column in said plenum chamber.

20. The cooling system, as set forth in claim 19, wherein said external air fan is mounted in line with said external air passageway near said exit port.

21. The cooling system, as set forth in claim 16, wherein said internal air intake port is located near a top of said heat exchanger column and said internal air exit port is located near a base of said heat exchanger column, and said internal air fan is mounted near said base of said heat exchanger column.

22. The cooling system, as set forth in claim 16, further comprising a divider plate mounted between said interior chamber of said plenum and said enclosure, and said external air exit port includes a collar extending through and above said divider plate.

23. The cooling system, as set forth in claim 16, further comprising an external air fan housing mounted in said heat exchanger column.

24. The cooling system, as set forth in claim 23, wherein said external air fan housing is detachably fastened to said heat exchanger column by fasteners.

25. The cooling system, as set forth in claim 24, wherein said external air fan housing includes:

a drawer housing said external air fan;

an outer housing accommodating said drawer; and at least one latch latching said drawer to said outer housing.

26. The cooling system, as set forth in claim 16, further comprising an internal air fan housing mounted in said heat exchanger column.

27. The cooling system, as set forth in claim 26, wherein said internal air fan housing is detachably fastened to said heat exchanger column by fasteners.

28. The built-in cooling system, as set forth in claim 1, wherein said heat exchanger column further comprises a serpentine heat exchanger element separating said external air and internal air and creating said large mutual contact surface area.

29. The built-in cooling system, as set forth in claim 16, wherein said at least one heat exchanger column further comprises a serpentine heat exchanger element separating said external air and internal air and creating said large mutual contact surface area.

* * * * *